(12) United States Patent
Kim

(10) Patent No.: US 12,538,735 B2
(45) Date of Patent: Jan. 27, 2026

(54) TAPE TRANSFER DEVICE

(71) Applicant: Samsung Electronics Co., Ltd., Suwon-si (KR)

(72) Inventor: Jwa Hyeon Kim, Suwon-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 189 days.

(21) Appl. No.: 18/429,791

(22) Filed: Feb. 1, 2024

(65) Prior Publication Data
US 2025/0038018 A1  Jan. 30, 2025

(30) Foreign Application Priority Data

Jul. 26, 2023 (KR) .................. 10-2023-0097280

(51) Int. Cl.
*B29C 65/00* (2006.01)
*H01L 21/67* (2006.01)
*B29C 65/50* (2006.01)

(52) U.S. Cl.
CPC ........ *H01L 21/67132* (2013.01); *B29C 65/50* (2013.01); *B29C 65/5092* (2013.01); *B29C 66/005* (2013.01)

(58) Field of Classification Search
CPC ... B29C 65/50; B29C 65/5092; B29C 66/005; H01L 21/67132
See application file for complete search history.

(56) References Cited

U.S. PATENT DOCUMENTS

| | | | |
|---|---|---|---|
| 9,502,276 B2 | 11/2016 | Bluck et al. | |
| 2005/0196525 A1 | 9/2005 | Phillips | |
| 2023/0330945 A1* | 10/2023 | Yang | H01M 4/04 |
| 2024/0087922 A1* | 3/2024 | Kizaki | H01L 21/30 |

FOREIGN PATENT DOCUMENTS

| | | |
|---|---|---|
| JP | 2005-094035 A | 4/2005 |
| KR | 2001-0085342 A | 9/2001 |
| KR | 10-2010-0060464 A | 6/2010 |
| KR | 10-2010-0060465 A | 6/2010 |
| KR | 10-2022-0094120 A | 7/2022 |

* cited by examiner

*Primary Examiner* — Philip C Tucker
*Assistant Examiner* — Nickolas R Harm
(74) *Attorney, Agent, or Firm* — Harness, Dickey & Pierce, P.L.C.

(57) ABSTRACT

A tape transfer device includes a moving part configured to move in a first direction, a screw passing through the moving part and extends in the first direction, a push plate spaced apart from the moving part in a second direction that intersects the first direction, a connecting part connecting the push plate and the moving part, and extending in the second direction, a columnar shaft passing through the push plate, and extending in the first direction, and a clamp on at least a part of a surface of the shaft and configured to protrude from and/or retreat from at least a part of the surface of the shaft.

20 Claims, 15 Drawing Sheets

TAPE TRANSFER DEVICE

CROSS-REFERENCE TO RELATED APPLICATION

This application claims priority from Korean Patent Application No. 10-2023-0097280 filed on Jul. 26, 2023 in the Korean Intellectual Property Office, and all the benefits accruing therefrom under 35 U.S.C. § 119, the contents of which in its entirety are herein incorporated by reference.

BACKGROUND

Various example embodiments relate to a tape transfer device.

In a semiconductor process, a tape such as an adhesive tape and/or cellophane may be used for temporarily fixing a wafer, protecting a surface of a wafer and the like. The tape used in such a semiconductor process may be difficult to transfer because a roll of such tape is bulky and heavy. Additionally or alternatively, if a person such as an operator transfers the tape or tape roll manually, there is a risk of injury to a transporter.

On the other hand, if the tape is dropped, because the quality of the tape may be deformed, it is or desirable to transport the tape safely. Therefore, research for safely and automatically transferring the tape is being conducted.

SUMMARY

Aspects of example embodiments provide a tape transfer device that may transfer a tape safely and automatically.

However, aspects of example embodiments are not restricted to the one set forth herein. The above and other aspects of various example embodiments will become more apparent to one of ordinary skill in the art to which inventive concepts pertains by referencing the detailed description given below.

According to some example embodiments, there is provided a tape transfer device comprising a moving part configured to move in a first direction, a screw passing through the moving part and extending in the first direction, a push plate spaced apart from the moving part in a second direction that intersects the first direction, a connecting part connecting the push plate and the moving part and extends in the second direction, a columnar shaft passing through the push plate and extending in the first direction, and a clamp on at least a part of a surface of the shaft and configured to protrude from and/or retreat from at least a part of the surface of the shaft.

Alternatively or additionally according to some example embodiments, there is provided a tape transfer device comprising a moving part configured to move in a first direction, a screw passing through the moving part and extending in the first direction, a push plate spaced apart from the moving part in a second direction intersecting the first direction, a connecting part connecting the push plate and the moving part and extending in the second direction, a first columnar shaft passing through the push plate and extending in the first direction, and a second columnar shaft, wrapped by the first shaft and extending in the first direction. The second shaft is configured to move in the first direction.

Alternatively or additionally according to various example embodiments, there is provided a tape transfer device comprising a moving part configured to move in a first direction, a piston extending in the first direction and including a rod that is connected to the moving part, the rod configured to move the moving part in the first direction, and a cylinder that wraps around the rod, a push plate spaced apart from the moving part in a second direction intersecting the first direction, a connecting part connecting the push plate and the moving part, and extends in the second direction, a columnar shaft passing through the push plate and extending in the first direction, and a clamp on at least a part of a surface of the shaft and configured to protrude from and/or retreat from at least a part of the surface of the shaft.

BRIEF DESCRIPTION OF DRAWINGS

The above and other aspects and features of inventive concepts will become more apparent by describing in detail illustrative example embodiments thereof with reference to the attached drawings, in which.

DETAILED DESCRIPTION OF VARIOUS EXAMPLE EMBODIMENTS

Figure 1:
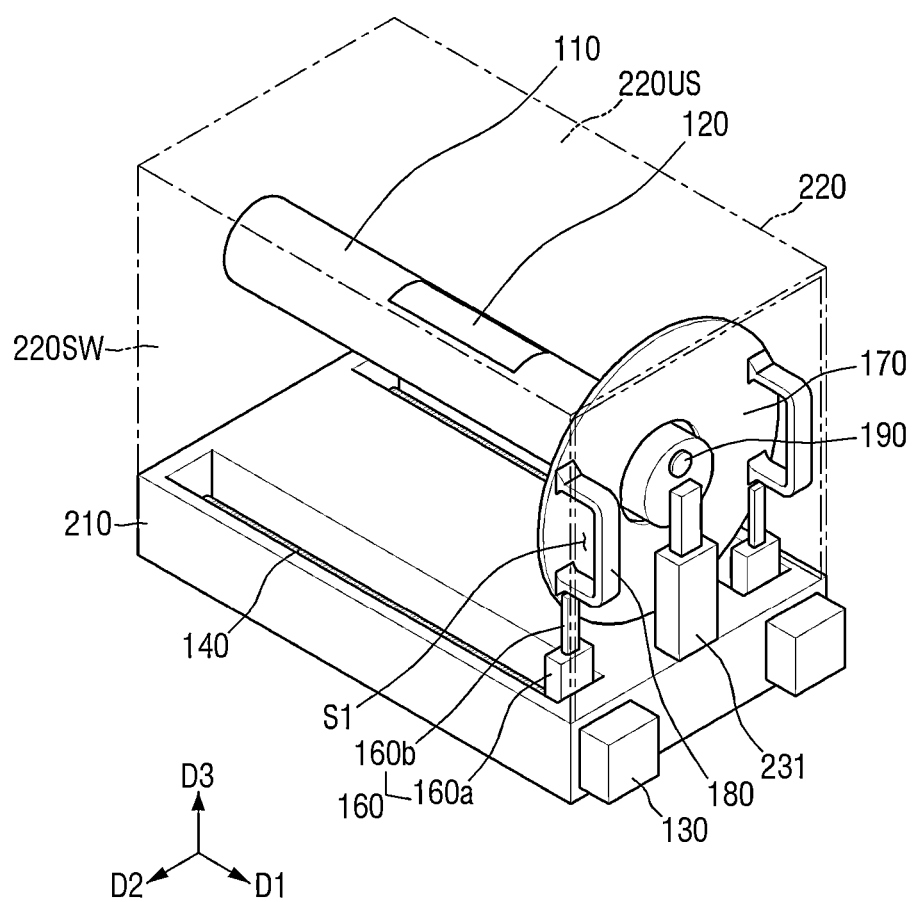
FIG. 1 is a diagram showing a tape transfer device according to some example embodiments.
Figure 2:
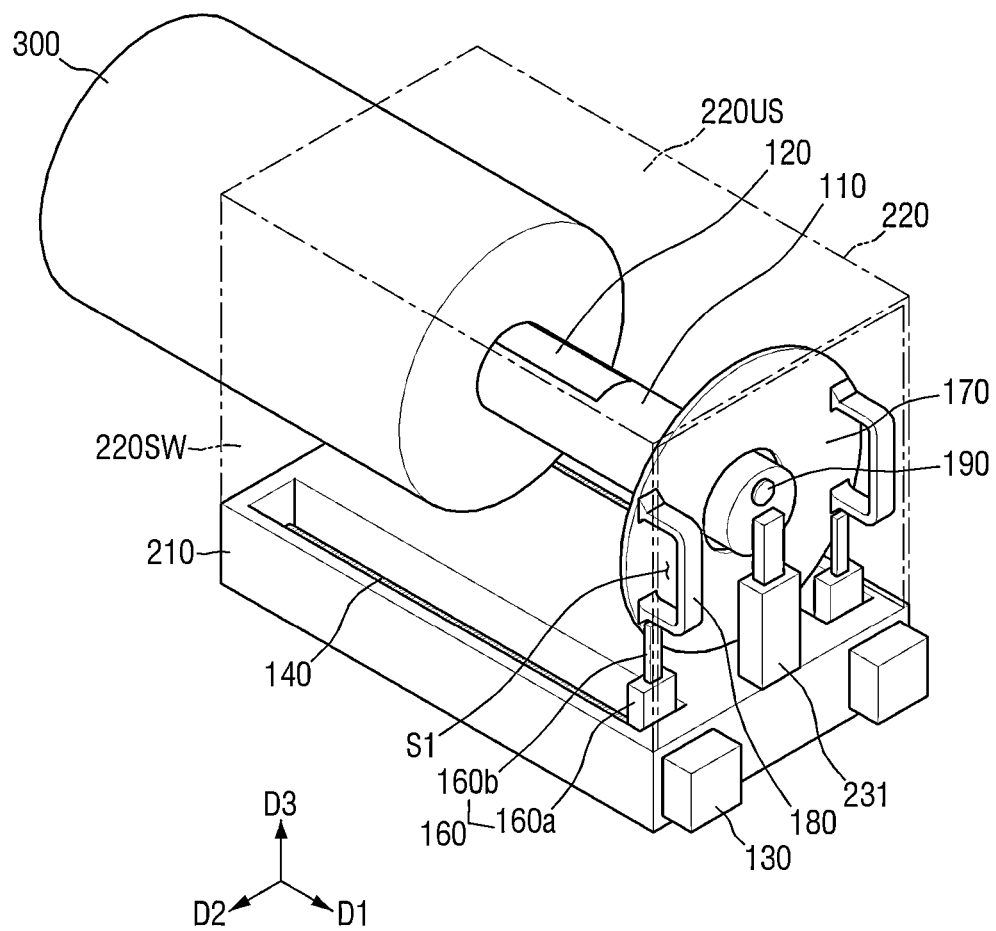
FIGS. 2 and 3 are diagrams for explaining an example in which a tape is mounted on the tape transfer device according to some example embodiments.
Figure 3:
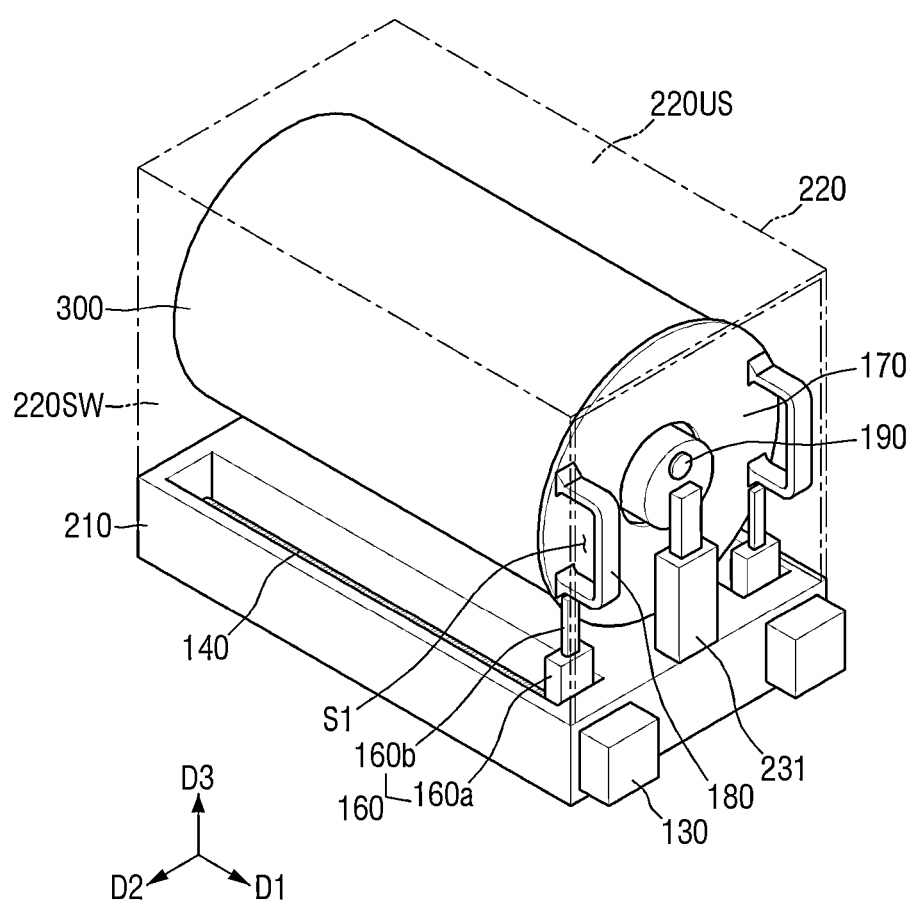

FIG. 1 is a diagram showing a tape transfer device according to some example embodiments. FIGS. 2 and 3 are diagrams for explaining an example in which a tape is mounted on the tape transfer device according to some example embodiments. FIGS. 4 to 7 are diagrams for explaining an operating method of the tape transfer device according to some example embodiments.

Referring to FIGS. 1 to 7, the tape transfer device according to some example embodiments may include a power supply 130, a screw 140, a moving part 150, a connecting part 160, a bent part 180, a push plate 170, a clamp 120, a valve 190, and a shaft 110.

The screw 140 may extend in a first direction D1. The first direction D1 may be a horizontal direction, e.g., horizontal with respect to a ground; however, example embodiments are not limited thereto. The screw 140 may have a full screw structure or a half screw structure.

The screw 140 may include screw threads. The screw threads may have a spiral form. The spiral form may be made up from a line in which a right triangle is wrapped around a cylinder.

The screw threads may be threaded at a standard pitch and/or gauge; example embodiments are not limited thereto. For example a pitch of the screw 140 and/or a length of the screw threads is not limited to that shown, and may have any suitable structure that may be coupled with the moving part 150 to be described later.

The power supply 130 may be connected to one end of the screw 140. For example, the power supply 130 may be attached to one end of the screw 140. In some example embodiments, the power supply 130 may supply DC voltage and/or AC voltage; example embodiments are not limited thereto.

Power may be supplied by the power supply 130. The screw 140 may rotate by the power supplied by the power supply 130. For example, the screw 140 may extend in the first direction D1 by the power supply 130, and may rotate about an imaginary axis that passes through the center of the screw 140.

The screw 140 may pass through the moving part 150. The moving part 150 may move in the first direction D1 along the screw 140.

In some example embodiments, a portion in which the moving part 150 and the screw 140 engage may have a nut shape. When the screw 140 rotates, the moving part 150 may move in the first direction D1.

In some example embodiments, the moving part 150 and the screw 140 may have a ball screw structure. Therefore, a ball may exist between the moving part 150 and the screw 140. When the screw 140 rotates, while the ball moves along the screw thread, the moving part 150 may move in the first direction D1.

Although the moving part 150 is shown in the form of a rectangular parallelepiped, example embodiments are not limited thereto. For example, the moving part 150 may have a cylindrical form or a hexagonal prism form.

The connecting part 160 may connect the moving part 150 and a push plate 170, which will be described later.

The connecting part 160 may include a first extension part 160a and a second extension part 160b.

The first extension part 160a may be connected to the moving part 150. The first extension part 160a may be brought into contact with an upper part of the moving part 150.

The first extension part 160a may extend in a third direction D3. The third direction D3 may be a direction that intersects the first direction D1.

The second extension part 160b may be connected to the first extension part 160a. The second extension part 160b may be brought into contact with the upper part of the first extension part 160a.

The second extension part 160b may be connected to the push plate 170. The second extension part 160b may be brought into contact with a back face of the push plate 170. As described herein, a back direction refers to a direction of the portion in which the clamp 120 exists on the basis of the push plate 170. In this specification, a front direction refers to a direction that is opposite to the back direction in the first direction D1.

In FIGS. 1 to 7, the connecting part 160 is shown to include two parts including the first extension part 160a and the second extension part 160b, but example embodiments are not limited thereto. The connecting part 160 may have any structure capable of connecting the moving part 150 and the push plate 170. For example, a one-piece component may connect the moving part 150 and the push plate 170. As another example, a three-piece component may connect the moving part 150 and the push plate 170.

Although the connecting part 160 is shown as being connected to the back face of the push plate 170 in FIGS. 1 to 7, example embodiment are not limited thereto. For example, the connecting part 160 may be connected to the front face of the push plate 170.

The bent part 180 may be connected to the push plate 170. The bent part 180 may be brought into contact with the back face of the push plate 170. The bent part 180 may be formed integrally with and/or welded with the push plate 170.

The bent part 180 may have a c-shape. Both ends of the bent part 180 may be brought into contact with the back face of the push plate 170.

A first space S1 may be defined by the bent part 180 and the push plate 170. For example, a human hand such as an adult human hand may grasp the bent part 180 through the first space S1. When a user moves in the first direction D1 while grabbing the bent part 180, the push plate 170 may simultaneously move in the first direction D1.

Each of the number of the screw 140, the moving part 150, the connecting part 160, the power supply 130, and the bent part 180 is shown as two, and each of them may be symmetrical with each other on the basis of a plane orthogonal to a second direction D2 including the center of the push plate 170. As described herein, the second direction D2 may be a direction intersecting (e.g., orthogonal with) the first direction D1 and the third direction D3. The second direction D2 may be horizontal; example embodiments are not limited thereto.

In FIGS. 1 to 7, although the number of each of the screw 140, the moving part 150, the connecting part 160, the power supply 130, and the bent part 180 is shown as two, example embodiments are not limited thereto. For example, there may be three screws 140, three moving parts 150, three connecting parts 160, three power supplies 130, and three bent parts 180.

Although the screw 140, the moving part 150, the connecting part 160, the power supply 130, and the bent part 180 are shown symmetrically on a plane orthogonal to the second direction D2 including the center of the push plate 170 in FIGS. 1 to 7, the embodiment is not limited thereto.

The push plate 170 may have a circular shape. Although the push plate 170 is only shown to have a circular shape in FIGS. 1 to 7, example embodiments is not limited thereto. For example, the push plate 170 may have a rectangular shape such as a square shape.

The push plate 170 may include a plane orthogonal to the first direction D1. For example, one plane of the push plate 170 may have a circular shape perpendicular to the first direction D1.

The push plate 170 may have a shape with an empty central portion. For example, the push plate 170 may have a donut shape with a circle passing through the center.

The empty central portion of the push plate 170 may be large enough for a shaft 110, described below, to pass therethrough.

The push plate 170 may have a constant thickness in the first direction D1. The push plate 170 may include two faces opposite to each other in the first direction D1. For example, the push plate 170 may include a front face of the push plate 170 and a back face of the push plate 170 that are opposite to each other in the first direction D1.

The push plate 170 may be spaced apart from the moving part 150 in the third direction D3.

The back face of the push plate 170 may be connected to the bent part 180 and the second extension part 160b. The front face of the push plate 170 may be smooth. For example, the front face of the push plate 170 may not be connected to other configurations.

The moving part 150, the connecting part 160, the push plate 170, and the bent part 180 may be integrally formed. Therefore, when the moving part 150 moves in the first direction D1, the connecting part 160, the push plate 170, and the bent part 180 may all move in the first direction D1.

The shaft 110 may extend in the first direction D1.

The shaft 110 may pass through the push plate 170.

The shaft 110 may have a columnar shape. For example, the shaft 110 may have a cylindrical shape; example embodiments are not limited thereto.

The shaft 110 may include two bottom faces and one side wall. The two bottom faces may have a circular shape; example embodiments are not limited thereto.

Although the shaft 110 is shown to have a cylindrical shape in FIGS. 1 to 7, the embodiment is not limited thereto. The shape of the shaft 110 may be deformed into various shapes depending on the shape of the tape 300.

In FIGS. 2 and 3, the tape 300, e.g., the roll of tape, may be supported by the shaft 110. For example, if the tape 300 has a hollow cylindrical shape and the empty portion of the tape 300 is defined as a hollow hole, the shaft 110 may be inserted into the hollow hole. When the shaft 110 is inserted into the hollow hole of the tape 300, the surface of the tape 300 that comes into contact with the shaft 110 may be an inner face of the tape 300.

At this time, if an external force is applied to the tape 300, the tape 300 may be inserted. The tape 300 may be inserted until one face of the tape 300 is brought into contact with the front face of the push plate 170.

The valve 190 may be formed on at least a part of the surface of the shaft 110. For example, the valve 190 may exist on the back face of the shaft 110.

Air inside the shaft 110 may be sealed or released through the valve 190. When the valve 190 is open, air may be inserted into the interior of the shaft 110. When the valve 190 is closed, the air inserted into the shaft 110 may not leak to the outside of the shaft 110.

Although the valve 190 is shown to exist on the back face of the shaft 110, example embodiments are not limited thereto.

The clamp 120 may be formed on at least a part of the surface of the shaft 110. For example, the clamp 120 may be formed on at least a part of a side wall of the shaft 110.

The clamp 120 may extend along the side wall of the shaft 110 in the first direction D1.

The clamp 120 may be, but is not limited to, in the form of a rectangle surrounding at least a part of the side wall of the shaft 110.

Figure 6:
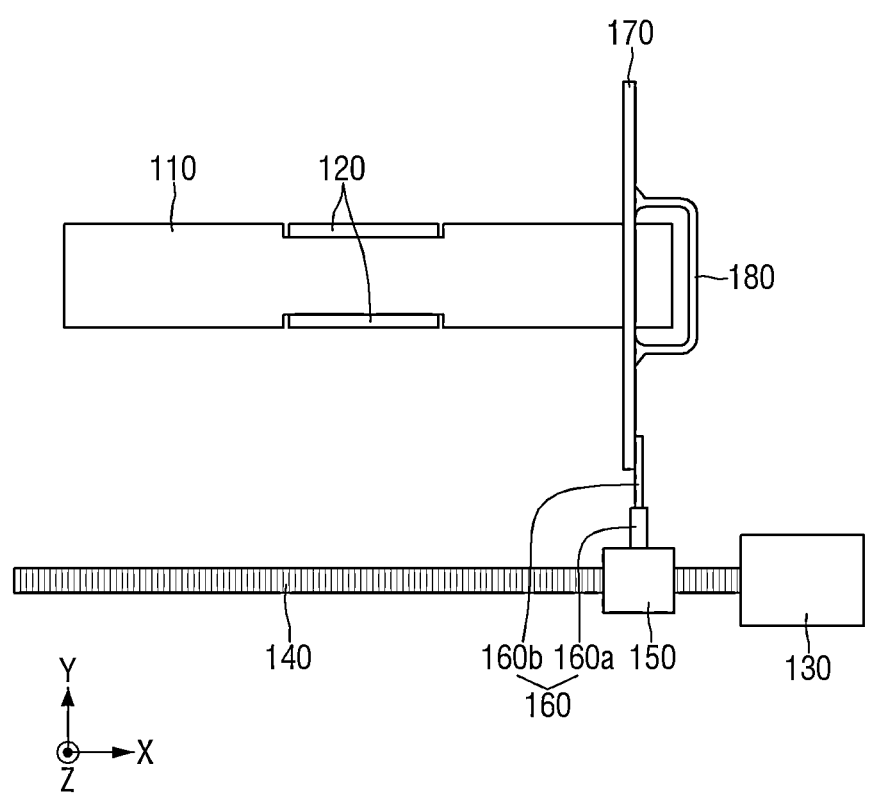
Figure 7:
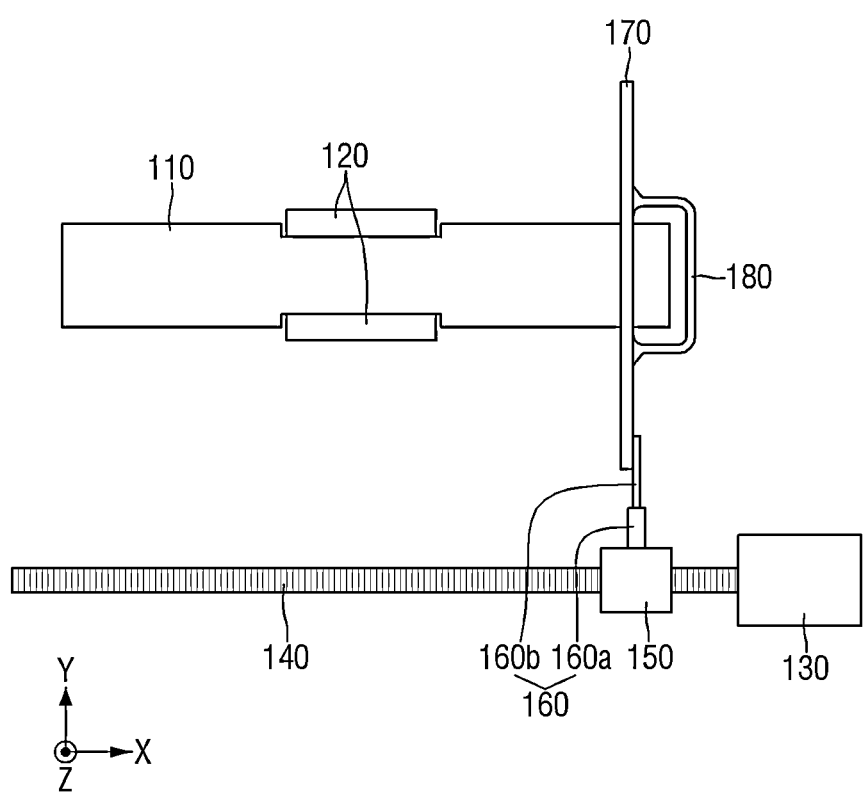

Although two clamps 120 are shown to exist in FIGS. 6 and 7, the number of clamps 120 is not limited thereto. For example, there may be three clamps 120.

Although the two clamps 120 are shown in FIGS. 6 and 7 to be spaced apart from each other in the third direction D3 on the side wall of the shaft 110, the position of the clamps 120 is not limited thereto. For example, the two clamps 120 may be spaced apart from each other in the second direction D2 on the side wall of the shaft 110.

The clamp 120 may be flexible. In some example embodiments, the clamp 120 may be formed of or may include a plastic; example embodiments are not limited thereto.

The shaft 110 may protrude from and/or retreat from at least a part of the surface of the shaft 110. For example, the clamp 120 may protrude from the side wall of the shaft 110 and/or may retreat from the side wall of the shaft 110.

When the clamp 120 protrudes from the side wall of the shaft 110 while the tape 300 is supported by the shaft 110, an empty space between the tape 300 and the shaft 110 may decrease. More specifically, the clamp 120 may be brought into contact with the inner face of the tape 300 located in the hollow portion. As a result, the clamp 120 may press the inner face of the tape 300 to firmly fix the tape 300.

When the clamp 120 retreats from the side wall of the shaft 110 while the tape 300 is supported by the shaft 110, the empty space between the tape 300 and the shaft 110 may increase. More specifically, the clamp 120 may not be brought into contact with the inner face of the tape 300 located in the hollow portion. As a result, because the clamp 120 is not brought into contact with the inner face of the tape 300 at all, the tape 300 may not be fixed. The transfer method for the tape 300 will be described referring again to FIGS. 4 and 5.

Figure 4:
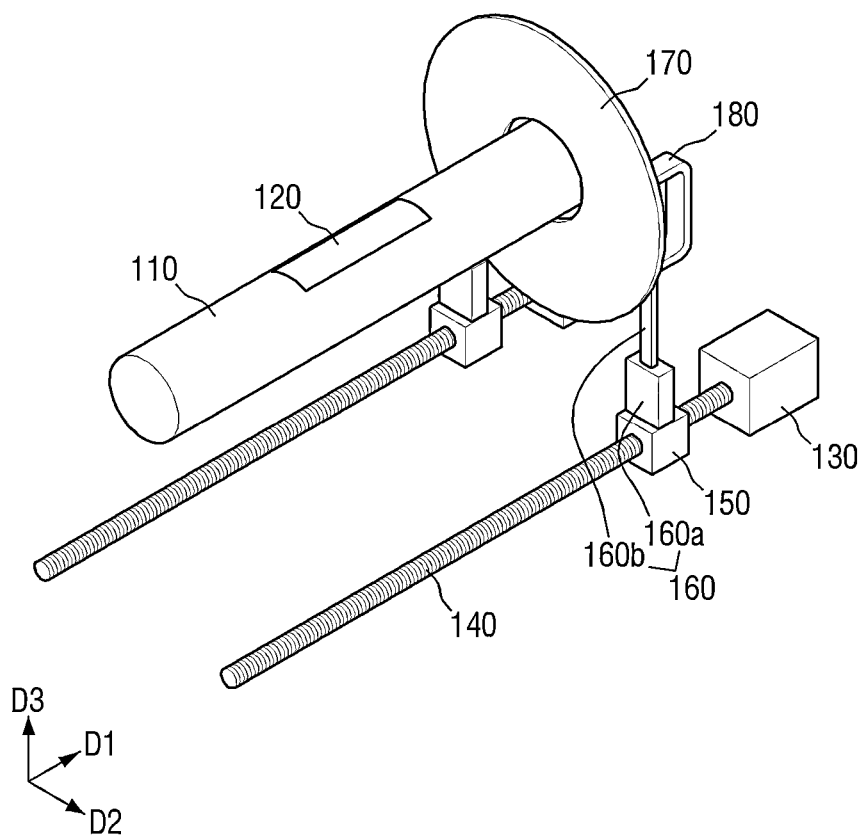
FIGS. 4 to 7 are diagrams for explaining an operating method of the tape transfer device according to some example embodiments.

The tape 300 may be inserted into the shaft 110 of the tape transfer device of FIG. 4. When the tape 300 is inserted, the front face of the push plate 170 and one face of the tape 300 may be brought into contact (e.g., direct contact) with each other.

The power supply 130 may then operate. When the power supply 130 operates, the moving part 150 may move in the first direction D1 by a ball screw manner. Since the moving part 150 is connected to the push plate 170 through the connecting part 160, the push plate 170 is also movable along the direction in which the moving part 150 moves.

Since the push plate 170 is brought into contact with the tape 300 inserted into the shaft 110, the tape 300 may be pushed in the direction in which the push plate 170 moves.

Figure 5:
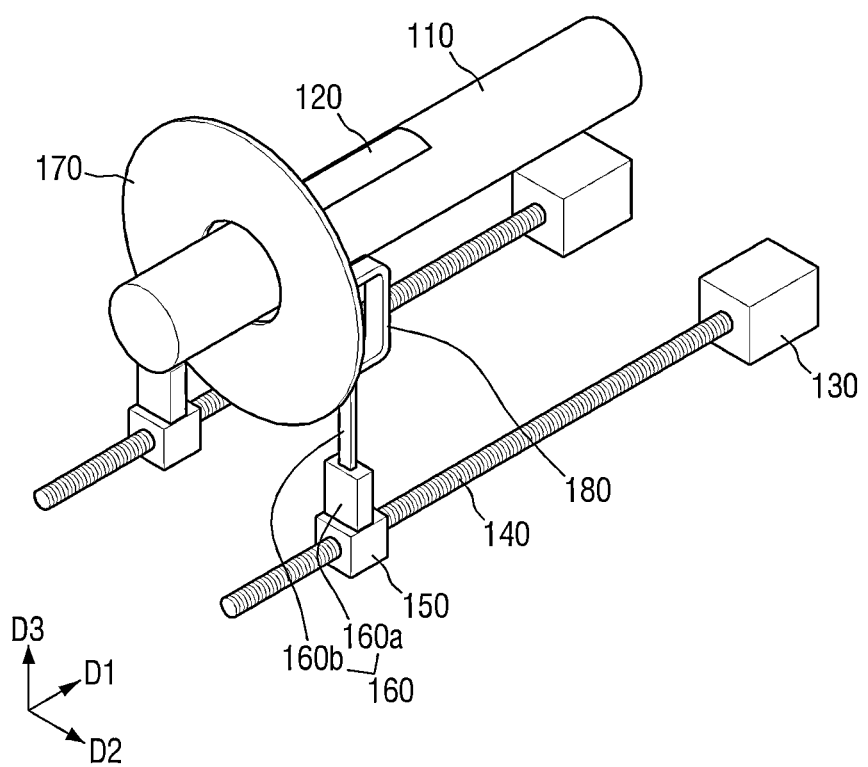

As in FIG. 5, when the push plate 170 moves sufficiently in the first direction D1, the tape 300 may be released from the shaft 110.

The method of fixing the tape 300 will be described with reference to FIGS. 6 and 7 again. As illustrated in FIGS. 6 and 7, directions X and Y may be horizontal directions, e.g., directions in the same plane as direction D1 and D2. Additionally, direction Z may be a vertical direction, e.g., the same as direction D3. Example embodiments are not limited thereto.

The tape 300 may be inserted into the shaft 110 of the tape transfer device of FIG. 6.

The valve 190 may then be opened to inject air into the interior of the shaft 110.

Thereafter, air may be sufficiently injected into the shaft 110 to close the valve 190.

Because the clamp 120 is flexible, the clamp 120 may protrude from the side wall of the shaft 110 when air is injected into the interior of the shaft 110. When the clamp 120 protrudes from the side wall of the shaft 110 as shown in FIG. 7 in the state in which the tape 300 is inserted into the shaft 110 of the tape transfer device, the inner face of the tape 300 may be brought into contact with the clamp 120. The tape 300 may not be bent, e.g., may be rigid. Therefore, the clamp 120 may press the inner face of the tape 300 to firmly fix the tape 300 to the tape transfer device.

Referring again to FIGS. 6 and 7, the method for releasing the tape 300 will be described.

The tape 300 may be inserted into shaft 110 of the tape transfer device of FIG. 7.

The valve 190 is then opened to release the air within the shaft 110.

Thereafter, air is sufficiently released from the interior of the shaft 110 and the valve 190 may be closed.

Since the clamp 120 is flexible, the clamp 120 may retreat from the side wall of the shaft 110 when air is released from the interior of the shaft 110. If the clamp 120 retreats from the side wall of the shaft 110 as in FIG. 6 in the state in which the tape 300 is inserted into the shaft 110 of the tape transfer device, the inner face of the tape 300 may not be brought into contact with the clamp 120. Therefore, since the clamp 120 does not press the inner face of the tape 300, the tape 300 may be released from the tape transfer device.

Figure 8:
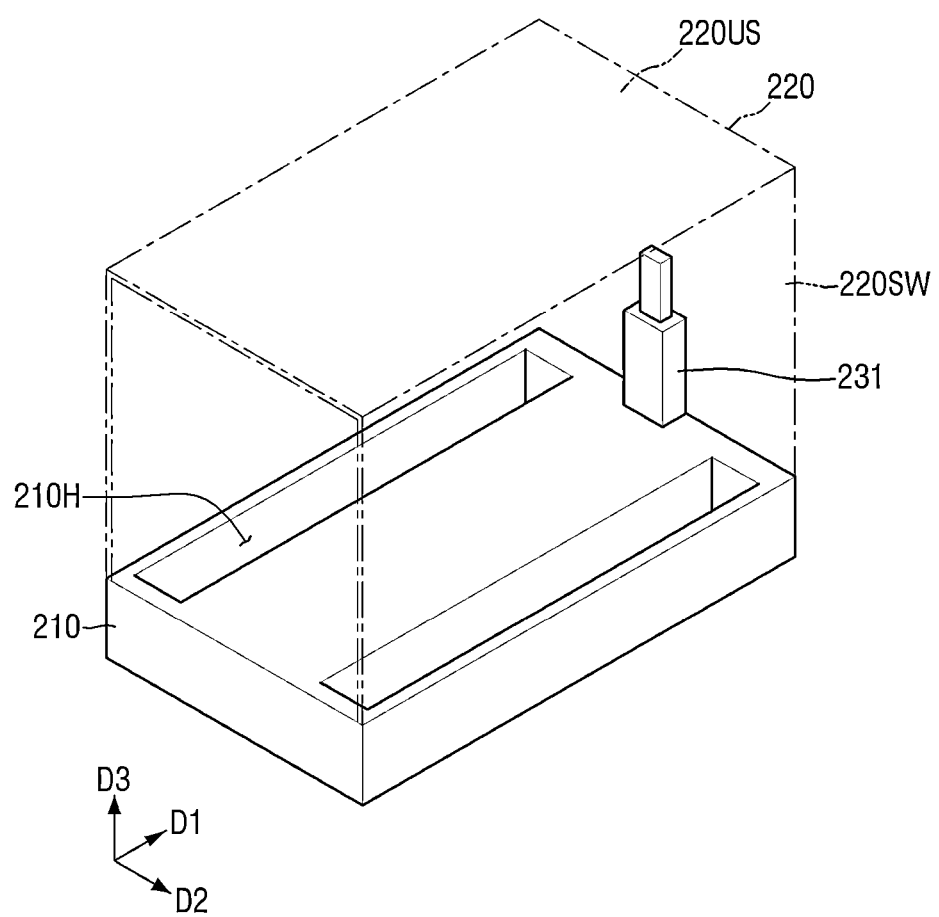
FIG. 8 is a diagram showing a housing that surrounds the tape transfer device of FIG. 1.

FIG. 8 is a diagram showing a housing that surrounds the tape transfer device of FIG. 1. Referring to FIGS. 1 and 8, the tape transfer device may be surrounded by the housing.

The housing may include a support part 210, a lid part 220, a first fixing part 231, and a transfer groove 210H.

The support part 210 may extend in the first direction D1. The support part 210 may have a plate shape including a plane orthogonal to the third direction D3.

The lid part 220 may have a c-shape. The lid part 220 may include two side walls 220SW and one upper face 200US.

The side wall 220SW of the lid part may be brought into contact with the upper face of the support part 210. The side wall 220SW of the lid part may extend from at least a part of the support part 210.

The two side walls 220SW of the lid part may be spaced apart from each other in the second direction D2. The two side walls 220SW of the lid part may each include a plane orthogonal to the second direction D2.

One upper face 200US of the lid part 220 may be connected to each of the two side walls 220SW of the lid part.

The upper face 200US of the lid part may be parallel to the support part 210. The upper face 200US of the lid part may include a plane orthogonal to the third direction D3.

Although the lid part 220 is shown to be formed of a transparent material, example embodiments are not limited thereto.

The first fixing part 231 may extend from at least a part of the support part 210 in the third direction D3.

Although the first fixing part 231 is shown to have a shape in which two rectangular parallelepipeds are stacked, the shape is not limited thereto.

The first fixing part 231 may be brought into contact with the back face of the shaft 110. The first fixing part 231 may be connected to the back face of the shaft 110.

When the first fixing part 231 and the back face of the shaft 110 are connected, the shaft 110 may be fixed. Therefore, a state in which the shaft 110 and the support part 210 are spaced apart in the third direction D3 may be maintained or may be more likely to be maintained.

The transfer groove 210H may be an empty space formed on the support part 210. The transfer groove 210H may pass through at least a part of the upper face of the support part 210. The transfer groove 210H may pass through at least a part of the back face of the support part 210.

The transfer groove 210H may extend in the first direction D1. Two transfer grooves 210H may exist at positions corresponding to the screws 140 of the semiconductor transfer device.

The two transfer grooves 210H may be spaced apart from each other in the second direction D2.

If a semiconductor transfer device is surrounded by the housing, the screw 140 of the semiconductor transfer device may be located inside the transfer groove 210H. When the semiconductor transfer device is surrounded by the housing, the moving part 150 of the semiconductor transfer device may be located inside the transfer groove 210H.

Since the screw 140 of the semiconductor transfer device and the transfer groove 210H of the housing both extend in the first direction D1, the moving part 150 through which the screw 140 passes may move in the first direction D1.

Figure 9:
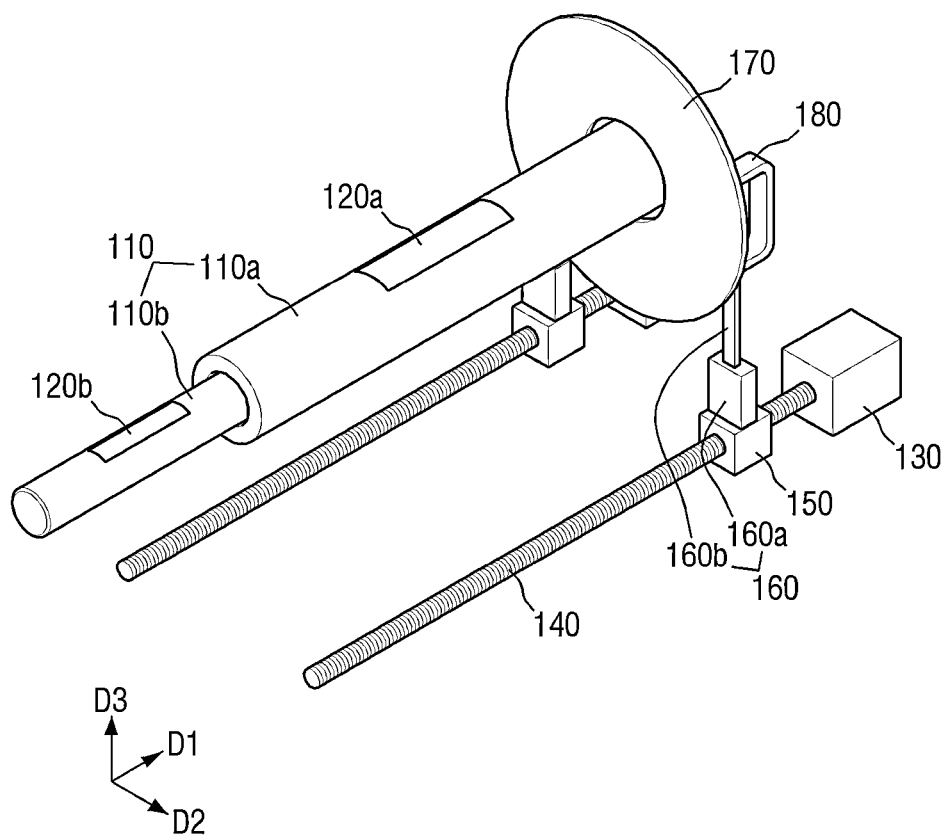
FIG. 9 is a diagram showing a tape transfer device according to some example embodiments.

FIG. 9 is a diagram showing a tape transfer device according to some example embodiments. For convenience of explanation, the explanation will focus on the points that are different from those explained using FIGS. 1 to 8.

The shaft 110 may include a first shaft 110a and a second shaft 110b.

The first shaft 110a may extend in the first direction D1.

The first shaft 110a may have a cylindrical shape. The first shaft 110a may include two bottom faces and one side wall. One of the two bottom faces may be circular and the other may be in the form of a donut with an empty central portion.

In FIG. 9, the first shaft 110a is shown to have a cylindrical shape, but the shape is not limited thereto. The shape of the first shaft 110a may be deformed into various shapes depending on the shape of the tape 300.

The second shaft 110b may extend in the first direction D1.

The second shaft 110b may have a cylindrical shape. The second shaft 110b may include two bottom faces and one side wall. The two bottom faces may be circular.

Although the second shaft 110b is shown to have a cylindrical shape in FIG. 9, the shape is not limited thereto. The shape of the second shaft 110b may be deformed into various shapes depending on the shape of the tape 300.

The diameter of the second shaft 110b may be smaller than the diameter of the first shaft 110a. For example, the diameter of one of the bottom faces of the second shaft 110b may be smaller than the diameter of the circular part of the bottom face of the first shaft 110a.

In some example embodiments, the first shaft 110a may wrap around the second shaft 110b.

In some example embodiments, the second shaft 110b may pass through the first shaft 110a. For example, the second shaft 110b may pass through the donut-shaped bottom face of the first shaft 110a.

The first clamp 120a may be formed on at least a part of the surface of the first shaft 110a. For example, the first clamp 120a may be formed on at least a part of the side wall of the first shaft 110a.

The first clamp 120a may extend in the first direction D1 along the side wall of the first shaft 110a.

The first clamp 120a may have, but is not limited to, a rectangular shape that surrounds at least a part of the side wall of the first shaft 110a.

The two first clamps 120a may exist on the side wall of the first shaft 110a while being spaced apart from each other in the third direction D3, but the position and number of the first clamps 120a are not limited thereto.

The first clamp 120a may be flexible, e.g., may be made of a flexible material such as but not limited to plastic.

The first clamp 120a may protrude and/or retreat from at least a part of the surface of the first shaft 110a. For example, the first clamp 120a may protrude from the side wall of the first shaft 110a or may retreat from the side wall of the first shaft 110a.

If the first clamp 120a protrudes from the side wall of the first shaft 110a while the tape 300 is supported by the first shaft 110a, the empty space between the tape 300 and the first shaft 110a may decrease. More specifically, the first clamp 120a may be brought into contact with the inner face of the tape 300 located in the hollow portion. As a result, the first clamp 120a may press the inner face of the tape 300 to firmly fix the tape 300.

When the first clamp 120a retreats from the side face of the first shaft 110a while the tape 300 is supported by the first shaft 110a, the empty space between the tape 300 and the first shaft 110a may increase. For example, the first clamp 120a may not be brought into contact with the inner face of the tape 300 located in the hollow portion. As a result, because the first clamp 120*a* is not brought into contact with the inner face of the tape 300 at all, the tape 300 may not be fixed.

The second clamp 120*b* may be formed on at least a part of the surface of the second shaft 110*b*. For example, the second clamp 120*b* may be formed on at least a part of the side wall of the second shaft 110*b*. In some example embodiments, the second shaft 110*b* may telescopically extend and/or retract from the first shaft 110*a*; example embodiments are not limited thereto.

The second clamp 120*b* may extend in the first direction D1 along the side wall of the second shaft 110*b*.

The second clamp 120*b* may have, but is not limited to, a rectangular shape that surrounds at least a part of the side wall of the second shaft 110*b*.

The two second clamps 120*b* may exist on the side wall of the second shaft 110*b* while being spaced apart from each other in the third direction D3, but the position and number of the second clamps 120*b* are not limited thereto.

The second clamp 120*b* may be flexible.

The second clamp 120*b* may protrude or retreat from at least a part of the surface of the second shaft 110*b*. For example, the second clamp 120*b* may protrude from or retreat from the side wall of the second shaft 110*b*.

When the second clamp 120*b* protrudes from the side wall of the second shaft 110*b* while the tape 300 is supported by the second shaft 110*b*, the empty space between the tape 300 and the second shaft 110*b* may decrease. More specifically, the second clamp 120*b* may be brought into contact with the inner face of the tape 300 located in the hollow portion. As a result, the second clamp 120*b* may press the inner face of the tape 300 to firmly fix the tape 300.

When the second clamp 120*b* retreats from the side of the second shaft 110*b* while the tape 300 is supported by the second shaft 110*b*, the empty space between the tape 300 and the second shaft 110*b* may increase. More specifically, the second clamp 120*b* may not be brought into contact with the inner face of the tape 300 located in the hollow portion. As a result, since the second clamp 120*b* is not brought into contact with the inner face of the tape 300 at all, the tape 300 may not be fixed.

Power may be supplied by the power supply 130, and the second shaft 110*b* may move in the first direction D1.

The second shaft 110*b* may move in the first direction D1. Therefore, the length of the shaft 110 in the first direction D1 including the first shaft 110*a* and the second shaft 110*b* may be varied. Therefore, the tape transfer device may transfer the tape 300 having various lengths in the first direction D1.

The shaft 110 including the first shaft 110*a* and the second shaft 110*b* may have a longer length in the first direction D1 than a case where only the first shaft 110*a* exists. Therefore, the tape transfer device may transfer the tape 300 having a long length in the first direction D1.

Figure 10:
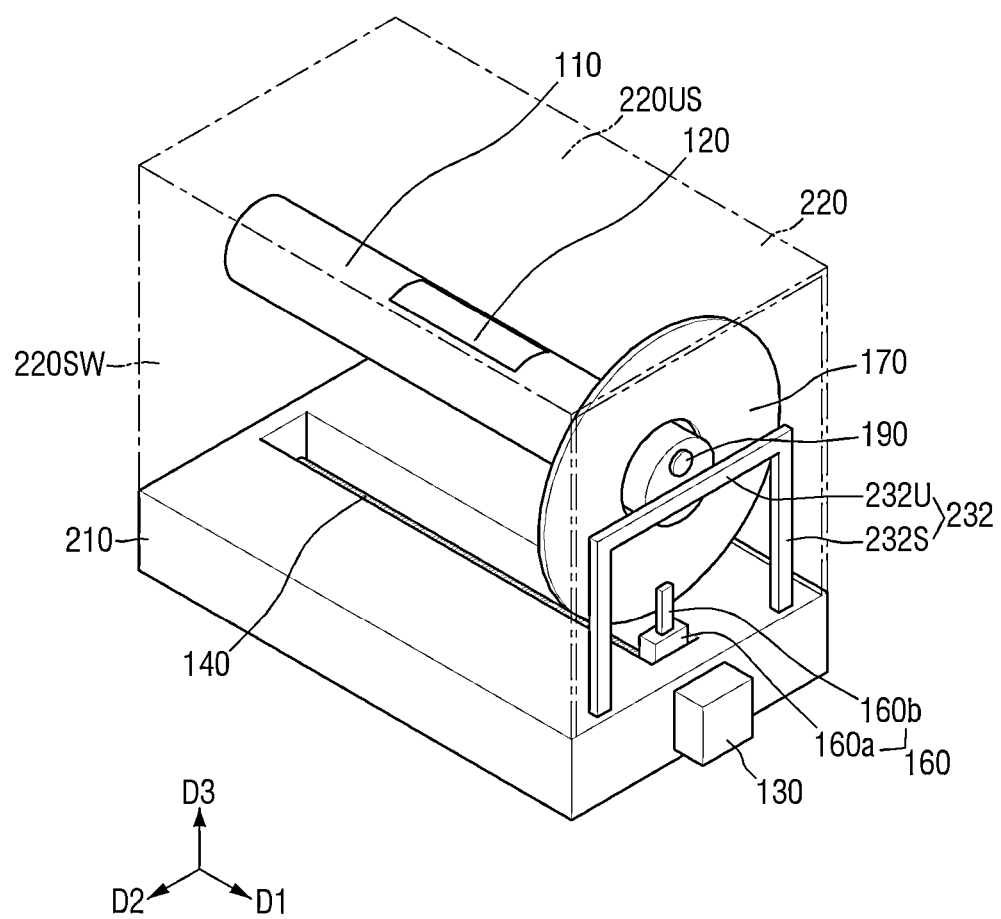
FIGS. 10 to 12 are diagrams showing a tape transfer device according to some example embodiments.
Figure 11:
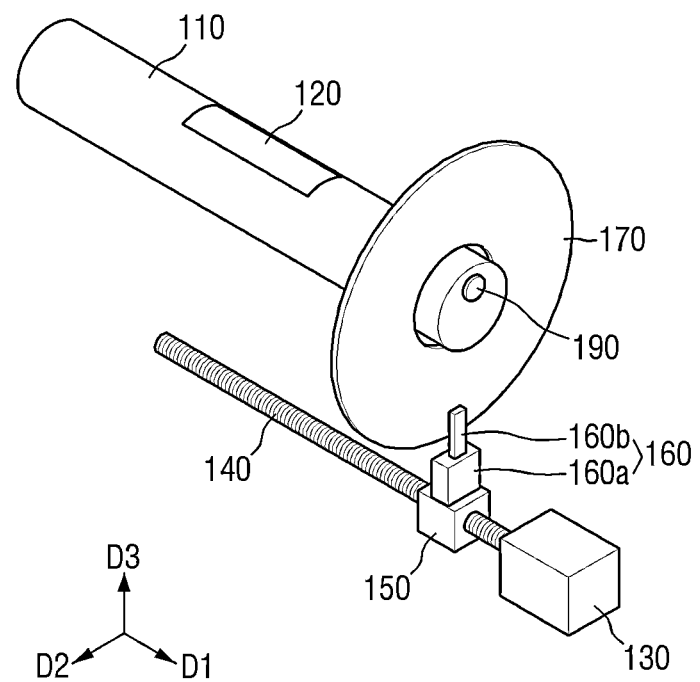
Figure 12:
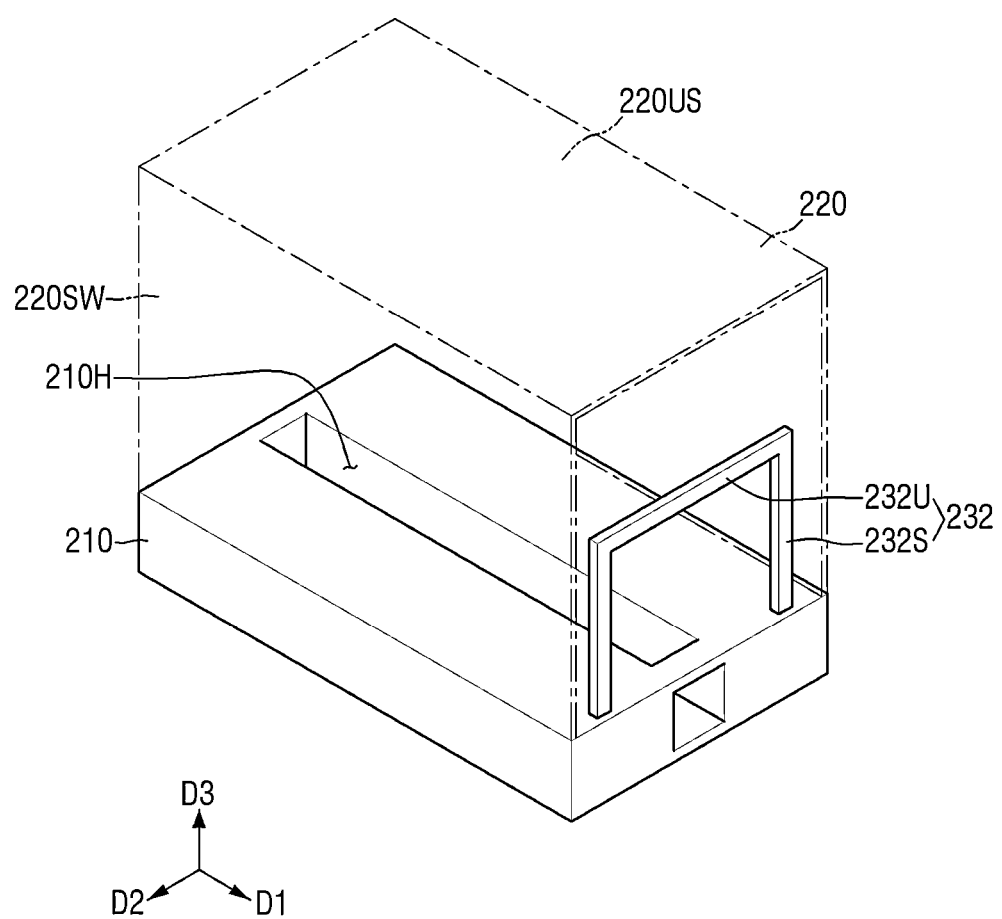

FIGS. 10 to 12 are diagrams showing a tape transfer device according to some example embodiments. For convenience of explanation, the explanation will focus on the points that are different from those explained using FIGS. 1 to 8.

Referring to FIGS. 10 to 12, the screw 140 may extend in the first direction D1. The screw 140 may have a full screw structure or a half screw structure.

The screw 140 may include screw threads. The screw threads may have a spiral shape. The spiral shape may be made up of a line in which a right triangle is wrapped around a cylinder.

The pitch of the screw 140 and/or the length of the screw threads are not limited to those shown in the drawings, and may be any suitable structure that may be fastened to the moving part 150 to be described later.

The power supply 130 may be attached to one end of the screw 140.

The screw 140 may rotate by the power supply 130. For example, the screw 140 may rotate by the power supply 130 around an arbitrary straight line extending in the first direction D1.

The screw 140 may pass through the moving part 150. The moving part 150 may move in the first direction D1 along the screw 140.

In some example embodiments, the portion in which the moving part 150 and the screw 140 engage may have a nut shape. When the screw 140 rotates, the moving part 150 may move in the first direction D1.

In some example embodiments, the moving part 150 and the screw 140 may have a ball screw structure. Therefore, a ball may exist between the moving part 150 and the screw 140. When the screw 140 rotates, while the ball moves along the threads of the screw 140, the moving part 150 may move in the first direction D1.

Although the moving part 150 is shown in the form of a rectangular parallelepiped, the form is not limited thereto.

The connecting part 160 may connect the moving part 150 and the push plate 170.

The connecting part 160 may include a first extension part 160*a* and a second extension part 160*b*.

The first extension part 160*a* may be connected to the moving part 150. The first extension part 160*a* may be brought into contact with the upper part of the moving part 150.

The first extension part 160*a* may extend in the third direction D3.

The second extension part 160*b* may be connected to the first extension part 160*a*. The second extension part 160*b* may be brought into contact with the upper part of the first extension part 160*a*.

The second extension part 160*b* may be connected to the push plate 170. The second extension part 160*b* may be brought into contact with the back face of the push plate 170.

In FIGS. 10 to 12, although the connecting part 160 is shown to include two parts including the first extension part 160*a* and the second extension part 160*b*, the embodiment is not limited thereto.

Although the connecting part 160 is shown as being connected to the back face of the push plate 170 in FIGS. 10 to 12, example embodiments are not limited thereto. For example, the connecting part 160 may be connected to the front face of the push plate 170.

The screw 140, the moving part 150, the connecting part 160, and the power supply 130 are each shown as one. Each of the screw 140, the moving part 150, the connecting part 160, and the power supply 130 may exist on a plane that includes the center of the push plate 170 and is orthogonal to the second direction D2.

The housing may include a support part 210, a lid part 220, a second fixing part 232, and a transfer groove 210H.

The support part 210 may extend in the first direction D1. The support part 210 may have a plate shape including a plane orthogonal to the third direction D3.

The lid part 220 may have a c-shape. The lid part 220 may include two side walls 200SW and one upper face 200US.

The side wall 220SW of the lid part may be brought into contact with the upper face of the support part 210. The side wall 220SW of the lid part may extend from at least a part of the support part 210.

The two side walls 220SW of the lid part may be spaced apart from each other in the second direction D2. The two side walls 220SW of the lid part may each include a plane orthogonal to the second direction D2.

One upper face 200US of the lid part 220 may be connected to each of the two side walls 220SW of the lid part.

The upper face 200US of the lid part may be parallel to the support part 210. The upper face 200US of the lid part may include a plane orthogonal to the third direction D3.

The second fixing part 232 may have a c-shape. The second fixing part 232 may include two side plates 232S and one upper plate 232U. The two side plates 232S and one upper plate 232U of the second fixing part 232 may be integrally formed.

Both ends of the second fixing part 232 may be connected to the upper face of the support part 210. For example, one ends of the two side plates 232S may be connected to the upper face of the support part 210.

The second fixing part 232 may be brought into contact with the back face of the shaft 110. The second fixing part 232 may be connected to the back face of the shaft 110. For example, the second fixing part 232 may be connected to the upper plate 232U of the shaft 110.

When the second fixing part 232 and the back face of the shaft 110 are connected, the shaft 110 may be fixed. Therefore, a state in which the shaft 110 and the support part 210 are spaced apart in the third direction D3 may be maintained or may be more likely to be maintained.

The transfer groove 210H may be an empty space formed on the support part 210. The transfer groove 210H may penetrate at least a part of the upper face of the support part 210. The transfer groove 210H may penetrate at least a part of the back face of the support part 210.

The transfer groove 210H may extend in the first direction D1. One transfer groove 210H may exist at a position corresponding to the screw 140 of the semiconductor transfer device.

When the semiconductor transfer device is surrounded by the housing, the screw 140 of the semiconductor transfer device may be located inside the transfer groove 210H. When the semiconductor transfer device is surrounded by the housing, the moving part 150 of the semiconductor transfer device may be located inside the transfer groove 210H.

Since both the screw 140 of the semiconductor transfer device and the transfer groove 210H of the housing extend in the first direction D1, the moving part 150 through which the screw 140 passes may move in the first direction D1.

Figure 13:
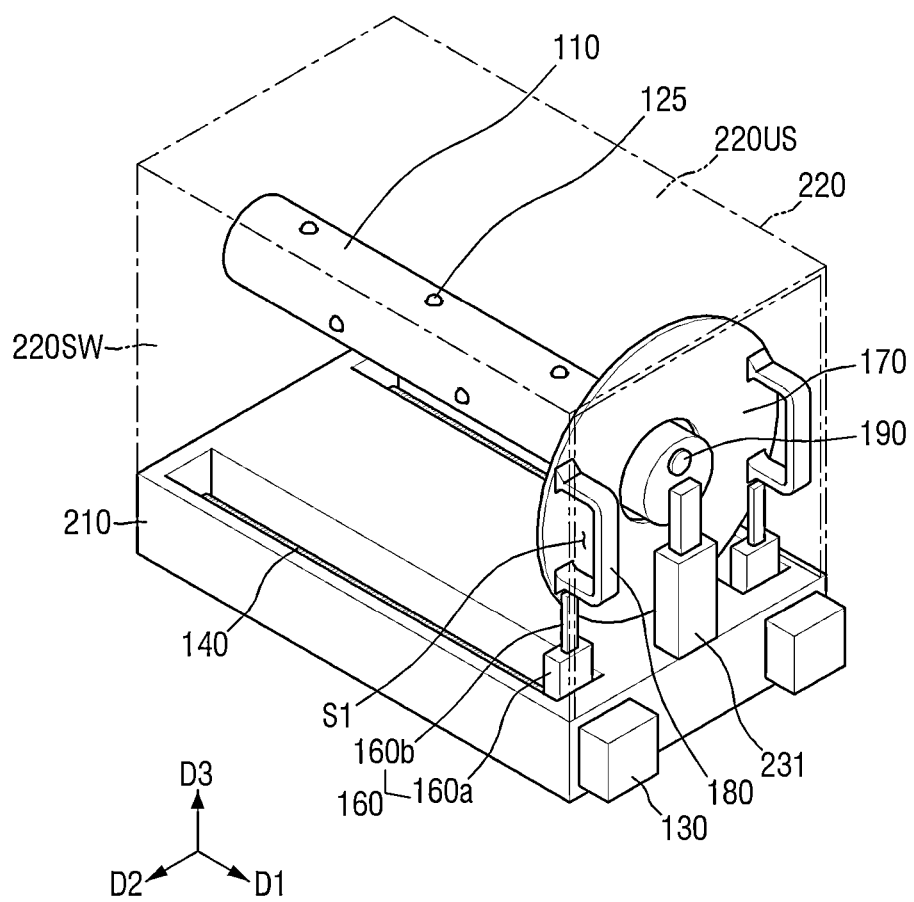
FIG. 13 is a diagram showing a tape transfer device according to some example embodiments.

FIG. 13 is a diagram showing a tape transfer device according to some example embodiments. For convenience of explanation, the explanation will focus on the points that are different from those explained using FIGS. 1 to 8.

A ball clamp 125 may be formed on at least a part of the surface of the shaft 110. For example, the ball clamp 125 may be formed on at least a part of a side wall of the shaft 110.

The ball clamp 125 may have, but not limited to, a circular shape.

Although five ball clamps 125 are shown to exist in FIG. 13, the number of ball clamps 125 is not limited thereto. For example, there may be six ball clamps 125.

In FIG. 13, the ball clamps 125 are shown as being disposed on the side wall of the shaft 110 with a certain regularity, but the position of the clamps 120 is not limited thereto. For example, a plurality of ball clamps 125 may exist on the side wall of shaft 110 while being randomly spaced apart from each other.

The ball clamp 125 may be flexible; e.g., the ball clamp 125 may be formed of a material such as but not limited to plastic.

The ball clamp 125 may protrude or retreat from at least a part of the surface of the shaft 110. For example, the ball clamp 125 may protrude from or retreat from a side wall of the shaft 110.

When the plurality of ball clamps 125 protrude from the side wall of the shaft 110 while the tape 300 is supported by the shaft 110, the empty space between the tape 300 and the shaft 110 may decrease. More specifically, the plurality of ball clamps 125 may be brought into contact with the inner face of the tape 300 located in the hollow portion. As a result, the plurality of ball clamps 125 may press the inner face of the tape 300 to firmly fix the tape 300.

When a plurality of ball clamps 125 retreat from the side wall of shaft 110 while tape 300 is supported by shaft 110, the empty space between the tape 300 and the shaft 110 may increase. More specifically, the plurality of ball clamps 125 may not be brought into contact with the inner face of the tape 300 located in the hollow portion. As a result, the tape 300 may not be fixed because the plurality of ball clamps 125 do not come into contact with the inner face of the tape 300.

Figure 14:
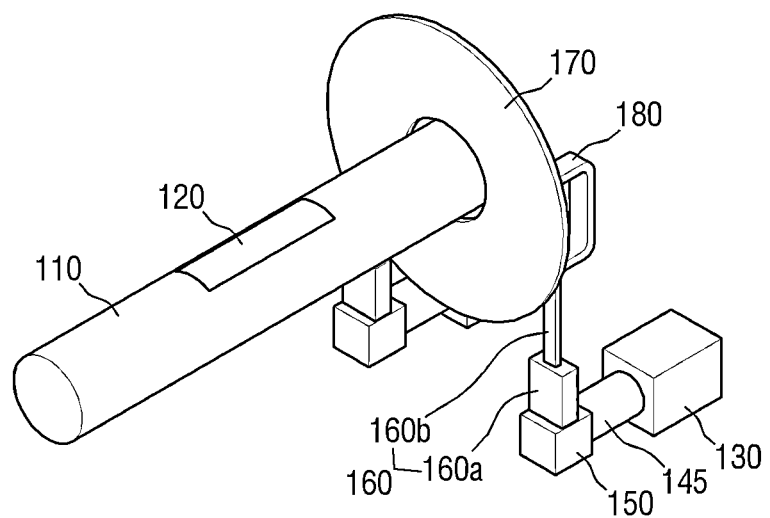
FIGS. 14 and 15 are diagrams showing a tape transfer devices according to some example embodiments.
Figure 14:
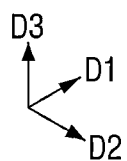
Figure 15:
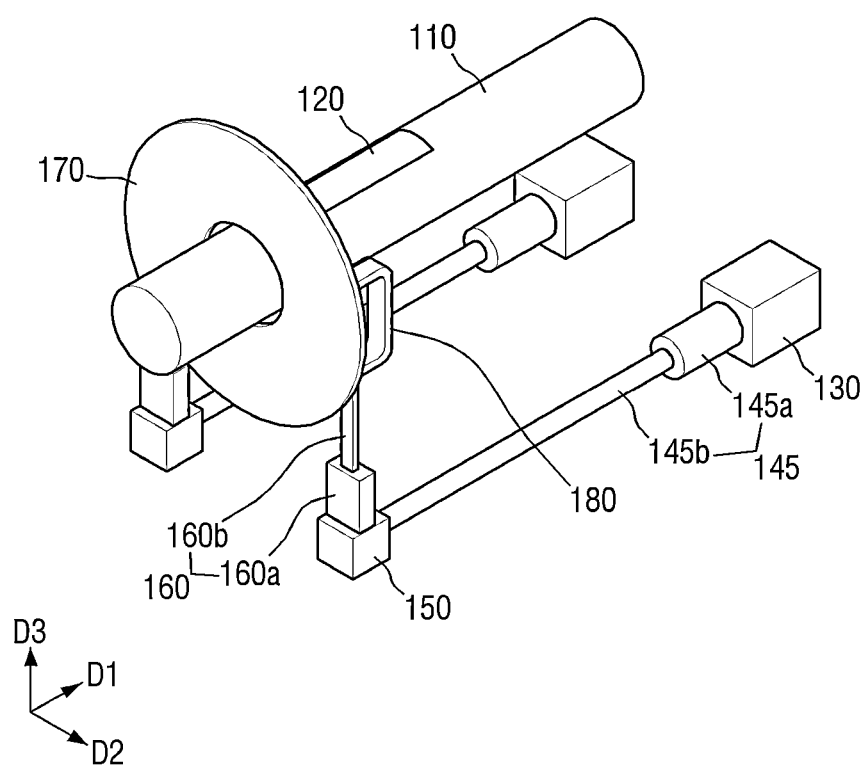

FIGS. 14 and 15 are diagrams showing a tape transfer devices according to some example embodiments. For convenience of explanation, the explanation will focus on the points that are different from those explained using FIGS. 1 to 8.

Referring to FIGS. 14 and 15, the tape transfer device may include a piston 145.

The piston 145 may be powered by the power supply 130. The piston 145 may move the moving part 150 in the first direction D1.

The piston 145 may include a cylinder 145a and a rod 145b.

The cylinder 145a may be connected to one side of the power supply 130.

The cylinder 145a may wrap around a rod 145b, which will be described later.

The cylinder 145a may have a columnar shape. For example, the cylinder 145a may have a cylindrical shape. The cylinder 145a may include two bottom faces and one side wall. One of the two bottom faces may be circular and the other may be in the form of a donut with an empty central portion.

Although the cylinder 145a is shown to have a cylindrical shape, the shape is not limited thereto.

The rod 145b may pass through the donut-shaped bottom face with an empty central portion in the bottom face of the cylinder 145a.

Although empty central portion rod 145b is shown to have a cylindrical shape, the shape is not limited thereto.

The rod 145b may be connected to one face of the moving part 150.

The rod 145b may move in the first direction D1. Since the rod 145b and the moving part 150 are connected, when the rod 145b moves in the first direction D1, the moving part 150 may also move in the same direction as the movement direction of the rod 145b.

The moving part 150, the connecting part 160, the push plate 170, and the bent part 180 may be integrally formed. Therefore, when the moving part 150 moves in the first direction D1, the connecting part 160, the push plate 170, and the bent part 180 may all move in the first direction D1.

Power is supplied by the power supply 130, and the rod 145b may move in the first direction D1. Therefore, the moving part 150 connected to the rod 145b may move in the first direction D1.

In concluding the above, those of ordinary skill in the art will appreciate that many variations and modifications may be made to the preferred embodiments without substantially departing from the principles of inventive concepts. Therefore, the example embodiments are used in a generic and descriptive sense only and not for purposes of limitation. Additionally, example embodiments are not necessarily mutually exclusive with one another. For example, some example embodiments may include one or more features described with reference to one or more figures, and may also include one or more other features described with reference to one or more other figures.

What is claimed is:

1. A tape transfer device comprising:
   a moving part configured to move in a first direction;
   a screw passing through the moving part and extends in the first direction;
   a push plate spaced apart from the moving part in a second direction that intersects the first direction;
   a connecting part connecting the push plate and the moving part, and extends in the second direction;
   a columnar shaft passing through the push plate, and extending in the first direction; and
   a clamp on at least a part of a surface of the shaft and configured to protrude from and/or retreat from at least a part of the surface of the shaft.

2. The tape transfer device of claim 1, further comprising:
   a power supply connected to one end of the screw,
   wherein the power supply is configured to supply power to cause the screw to rotate and to allow the moving part to move in the first direction.

3. The tape transfer device of claim 2,
   wherein the screw is configured to rotate about an imaginary axis that passes through a center of the screw and extends in the first direction.

4. The tape transfer device of claim 1,
   wherein the clamp is flexible.

5. The tape transfer device of claim 1, further comprising:
   a valve on at least a part of a surface of the shaft,
   wherein the valve is configured to seal and/or release air inside the shaft.

6. The tape transfer device of claim 1,
   wherein the clamp extends in the first direction.

7. The tape transfer device of claim 1,
   wherein the clamp is circular.

8. A tape transfer device comprising:
   a moving part configured to move in a first direction;
   a screw passing through the moving part and extends in the first direction;
   a push plate spaced apart from the moving part in a second direction that intersects the first direction;
   a connecting part connecting the push plate and the moving part, and extends in the second direction;
   a first columnar shaft passing through the push plate and extending in the first direction; and
   a second columnar shaft, wrapped by the first shaft and extending in the first direction,
   wherein the second shaft is configured to move in the first direction.

9. The tape transfer device of claim 8, further comprising:
   a first clamp on at least a part of a surface of the first shaft, and configured to protrude from and/or retreat from at least a part of the surface of the first shaft.

10. The tape transfer device of claim 8, further comprising:
    a second clamp on at least a part of a surface of the second shaft, and configured to protrude from and/or retreat from at least a part of the surface of the second shaft.

11. The tape transfer device of claim 8, further comprising:
    a power supply connected to one end of the screw,
    wherein the power supply is configured to supply power to cause the screw to rotate and to allow the moving part to move in the first direction.

12. The tape transfer device of claim 11,
    wherein the screw is configured to rotate about an imaginary axis that passes through a center of the screw and extends in the first direction.

13. The tape transfer device of claim 8, further comprising:
    a power supply connected to one end of the screw,
    wherein the power supply is configured to supply power to cause the second shaft to move in the first direction.

14. The tape transfer device of claim 8, further comprising:
    a valve on at least a part of a surface of the first shaft,
    wherein the valve is configured to seal and/or release air inside the first shaft.

15. A tape transfer device comprising:
    a moving part configured to move in a first direction;
    a piston extending in the first direction, and includes a rod that is connected to the moving part and configured to move the moving part in the first direction;
    a cylinder that wraps around the rod;
    a push plate spaced apart from the moving part in a second direction that intersects the first direction;
    a connecting part connecting the push plate and the moving part, and extending in the second direction;
    a columnar shaft passing through the push plate, and extending in the first direction; and
    a clamp on at least a part of a surface of the shaft and configured to protrude from and/or retreat from at least a part of the surface of the shaft.

16. The tape transfer device of claim 15, further comprising:
    a power supply connected to one end of the piston,
    wherein power supply is configured to supply power to cause the moving part to move in the first direction.

17. The tape transfer device of claim 15,
    wherein the clamp is flexible.

18. The tape transfer device of claim 15, further comprising:
    a valve on at least a part of a surface of the shaft,
    wherein the valve is configured to seal and/or release air inside the shaft.

19. The tape transfer device of claim 15,
    wherein the clamp extends in the first direction.

20. The tape transfer device of claim 15,
    wherein the clamp has a circular shape.

* * * * *